United States Patent
Saha et al.

(10) Patent No.: US 9,950,462 B2
(45) Date of Patent: Apr. 24, 2018

(54) METHOD TO FABRICATE ASYMMETRIC WRINKLES USING BIAXIAL STRAINS

(71) Applicants: Sourabh Kumar Saha, Livermore, CA (US); Martin Luther Culpepper, Georgetown, MA (US)

(72) Inventors: Sourabh Kumar Saha, Livermore, CA (US); Martin Luther Culpepper, Georgetown, MA (US)

(73) Assignee: Sourabh Kumar Saha, Livermore, CA (US)

(*) Notice: Subject to any disclaimer, the term of this patent is extended or adjusted under 35 U.S.C. 154(b) by 0 days.

(21) Appl. No.: 15/382,604

(22) Filed: Dec. 17, 2016

(65) Prior Publication Data

US 2017/0095966 A1 Apr. 6, 2017

Related U.S. Application Data

(62) Division of application No. 14/590,448, filed on Jan. 6, 2015, now Pat. No. 9,597,833.

(Continued)

(51) Int. Cl.
*B29C 55/16* (2006.01)
*B29C 55/02* (2006.01)
(Continued)

(52) U.S. Cl.
CPC .......... *B29C 55/16* (2013.01); *B29C 37/0025* (2013.01); *B29C 55/005* (2013.01);
(Continued)

(58) Field of Classification Search
CPC ....... B29C 55/16; B29C 55/005; B29C 55/20; B29C 55/023; B29C 37/0025;
(Continued)

(56) References Cited

U.S. PATENT DOCUMENTS

| 7,978,416 B2 | 7/2011 | Crosby et al. |
| 2009/0297776 A1 | 12/2009 | Crosby et al. |

(Continued)

OTHER PUBLICATIONS

NPL-1. Rand, Charles J., et al. "Fracture-induced alignment of surface wrinkles." Soft Matter 4.9 (2008): 1805-1807. (Year: 2008).*

Bowden, Ned, et al. "Spontaneous formation of ordered structures in thin films of metals supported on an elastomeric polymer." Nature 393.6681 (1998): 146-149. (Year: 1998).*

Rand, Charles J., Renee Sweeney, Mary Morrissey, Lauren Hazel, Alfred J. Crosby. Fracture-induced alignment of surface wrinkles. Soft Matter, Jul. 23, 2008 , 4(9), pp. 1805-1807, The Royal Society of Chemistry, U.K.

(Continued)

*Primary Examiner* — Matthew J Daniels
*Assistant Examiner* — Leith S Shafi

(57) ABSTRACT

Wrinkling of supported thin films is a strain-driven phenomenon that enables scalable and low-cost fabrication of periodic micro and nano scale structures. The morphology of wrinkles depends on both the magnitude and the nature of compressive strains that are applied to the thin film. This disclosure presents the methods to fabricate asymmetric 2-D wrinkled structures using biaxial compressive strains. The method relies on the dependence of wrinkle morphology on both strains and strain paths to generate asymmetric 2D wrinkles. Asymmetry is achieved by deliberately traversing the system through a strain state that creates cracks along a preferential direction. Fabricated patterns include non-uniform zigzag wrinkles that demonstrate period doubling only along one direction.

20 Claims, 10 Drawing Sheets

Related U.S. Application Data

(60) Provisional application No. 61/923,912, filed on Jan. 6, 2014.

(51) Int. Cl.
  *B29C 55/20* (2006.01)
  *B29C 55/00* (2006.01)
  *B29C 37/00* (2006.01)
  *C23C 14/20* (2006.01)
  *C23C 16/06* (2006.01)
  *B29K 83/00* (2006.01)
  *B29L 9/00* (2006.01)

(52) U.S. Cl.
  CPC ............ *B29C 55/023* (2013.01); *B29C 55/20* (2013.01); *C23C 14/20* (2013.01); *C23C 16/06* (2013.01); *B29K 2083/00* (2013.01); *B29L 2009/008* (2013.01)

(58) Field of Classification Search
  CPC ... C23C 16/06; C23C 14/20; B29L 2009/008; B29K 2083/00
  See application file for complete search history.

(56) References Cited

U.S. PATENT DOCUMENTS

2010/0116430 A1* 5/2010 Yang ............... C23C 26/00
  156/275.7
2014/0017454 A1* 1/2014 Boyce ............... C09D 5/28
  428/187

OTHER PUBLICATIONS

Chung, Jun Young, Jung-Hyun Lee, Kathryn L. Beers, Christopher M. Stafford. Stiffness, strength, and ductility of nanoscale thin films and membranes: a combined wrinkling-cracking methodology. Nano Letters, Jul. 15, 2011, 11(8), pp. 3361-3365, ACS Publications, U.S.

Fabian Brad, Hugues Vandeparre, Abbas Sabbah, Christophe Poulard, Arezki Boudaoud, Pascal Damman, Multiple-length-scale elastic instability mimics parametric resonance of nonlinear oscillators. Nature Physics, Oct. 31, 2010, 7(1), pp. 56-60, Nature Publishing Group, U.K.

* cited by examiner ial stage is compact and is capable of providing uniaxial and sequential non-equibiaxial stretching. The stage also has alignment features that enable one to register it to a vision system. This enables performing real-time in-situ visualization of the wrinkles as stretches are varied. Thus, this system is (i) an effective tool to experimentally study and characterize wrinkle formation and (ii) manufacturing equipment for low-cost fabrication of micro and nano scale patterns. By enabling fabrication of complex micro and nano scale patterns, this system reduces the overall cost of manufacturing micro and nano-enabled products by a factor of at least 10.

US 9,950,462 B2

METHOD TO FABRICATE ASYMMETRIC WRINKLES USING BIAXIAL STRAINS

RELATED APPLICATIONS

This application is a divisional of U.S. application Ser. No. 14/590,448 filed on Jan. 6, 2015; this application also claims the benefit of U.S. Provisional Application No. 61/923,912 filed on Jan. 6, 2014. The entire contents of both of these applications are incorporated herein by reference.

BACKGROUND OF THE INVENTION

This divisional application relates to methods of fabricating asymmetric 2-D wrinkle that are formed via compressive biaxial strains in bilayer composite materials and more particularly to methods of fabricating physical micro and nano scale structures that are generated upon compression of thin films.

Wrinkling is a strain-driven self-organization phenomenon that is commonly observed in natural systems over a wide length scale. Recently, this phenomenon has been incorporated into engineered systems to generate micro and nano scale patterns. For example, wrinkling of bilayer materials has been used to fabricate periodic sinusoidal patterns for thin film metrology, stretchable electronics, and microfluidics applications. Due to its inherent affordability and manufacturing scalability, pattern generation via wrinkling is an attractive potential alternative to more expensive cleanroom-based techniques such as e-beam lithography. However, practical import of this process is limited by the lack of flexibility, i.e., due to the inability to fabricate a variety of complex 2-D patterns. This is due to the limited ability of current tensile stages to provide the means to apply large, accurate, and/or non-equibiaxial strains within a small footprint. It is the goal of this invention to provide such a stage thereby enabling one to explore and access a wider design space for fabricating and tuning wrinkled patterns.

Wrinkles in compressed bilayer systems are formed due to buckling-based instabilities. The mechanism of wrinkling is similar to Euler buckling of columns under compression. A schematic of this process is illustrated in FIG. 1. Essential elements of these bilayer systems are: (i) a film 10 that is thin relative to the base, (ii) mismatch in the elastic moduli of the film and the base 12 with the film being stiffer than the base, and (iii) loading conditions 14 that generate in-plane compressive strain in the film. In such systems, the state of pure compression becomes unstable beyond a critical strain and wrinkles are formed via periodic bending of the film/base. The period of wrinkles ($\lambda$) is determined by the competing dependence of strain energy on period in the film versus in the base. The amplitude (A) is determined by the amount of applied compressive strain. Several different techniques have been developed in the past to (i) generate and join/bond the film to the base, (ii) generate moduli mismatch, and (iii) apply uniaxial and equibiaxial strains to the film. Analytical and computational predictive models for uniaxial and equibiaxial strains have also been developed. As such, these techniques and models provide a framework for performing predictive design and fabrication of periodic wrinkle patterns.

Although current techniques and models are a valuable toolkit for predictive design and fabrication of wrinkled patterns, they are still inadequate in satisfying the need for a variety of different complex patterns. This is primarily because only a small subset of the feasible design space is accessible via existing experimental techniques. The set of wrinkle patterns that can be fabricated is limited by the achievable range and types of compressive strains. For example, (i) below a threshold strain, only the single-period sinusoidal mode can be achieved via uniaxial strains and (ii) only a limited set of symmetric 2-D modes can be achieved via equibiaxial strains. Existing techniques that rely on thermal expansion or volumetric swelling to generate strains can provide only a limited set of strain states. For example, mismatched thermal expansion of an isotropic film on an isotropic base generates equibiaxial strains. Due to this, exploring the design space for large uniaxial or non-equibiaxial strains becomes a material selection problem. This coupling between strain and materials can be eliminated by using mechanical stages to introduce strains via stretching of the base layer. However, existing biaxial mechanical stages are often too large to use within vacuum chamber based equipment that are necessary for generation of thin films during wrinkle fabrication. Thus, there is a need to develop a mechanical stage that has a small form factor and provides the means to apply large, accurate, and non-equibiaxial strains.

Compact mechanical stages that are capable of providing large non-equibiaxial strains become a necessity when a variety of complex wrinkle patterns are required. The present biaxial tensile stage is compact and is capable of providing uniaxial and sequential non-equibiaxial stretching. The stage also has alignment features that enable one to register it to a vision system. This enables performing real-time in-situ visualization of the wrinkles as stretches are varied. Thus, this system is (i) an effective tool to experimentally study and characterize wrinkle formation and (ii) manufacturing equipment for low-cost fabrication of micro and nano scale patterns. By enabling fabrication of complex micro and nano scale patterns, this system reduces the overall cost of manufacturing micro and nano-enabled products by a factor of at least 10.

SUMMARY OF THE INVENTION

The biaxial stage according to the invention consists of: (i) fixtures to clamp and hold films onto the stage, (ii) linear bearings for motion guidance, (iii) actuators for stretch/displacement control, (iv) base with kinematic coupling for registration, and (v) the structural frame. The purpose of the film clamping fixtures is to hold the edges of the film stationary along the actuated direction while allowing for motion along the orthogonal in-plane direction. To enable control of film stretch, the stage platforms were mounted on linear beatings and actuated individually and manually by micrometer heads. The purpose of kinematic couplings in the base is to implement an accurate and quick attach/detach mechanism to register the stage to the metrology frame. The purpose of the structural frame is to maintain structural rigidity and provide alignment features for assembling the modules of the stage.

The essential design features that ensure that the stage satisfies the functional requirements imposed b r wrinkling process are: (i) the actuator was integrated onto the stage to enable real-time tuning of wrinkles, (ii) non-essential motion guidance elements were eliminated to reduce the size of the stage, and (iii) a mechanism for quick and accurate registration of the stage to the vision system was implemented to enable in-situ imaging. In the present stage, integrated onboard actuation was achieved by using manually-actuated micrometer heads that were mounted on the stage. To reduce the size of the stage, mechanical couplings between the actuators and the movable platforms of the stage were eliminated; instead, the micrometer heads push directly onto the stage platforms during actuation. Additionally, a kinematic coupling was built into the base of the stage to quickly and accurately register the stage to a vision system.

BRIEF DESCRIPTION OF THE DRAWINGS

FIG. 2(a) illustrates stretching of PDMS base. FIG. 2(b) illustrates plasma oxidation. FIG. 2(c) illustrates release of pre-stretch. FIG. 2(d) illustrates the resulting wrinkle pattern.

FIG. 8(a) is a sequence of stretches applied to the film. FIG. 8(b) illustrates the images of the wrinkled patterns that are generated at each step. Scale bars in the images are 30 um long.

DESCRIPTION OF THE PREFERRED EMBODIMENT

Figure 1A:
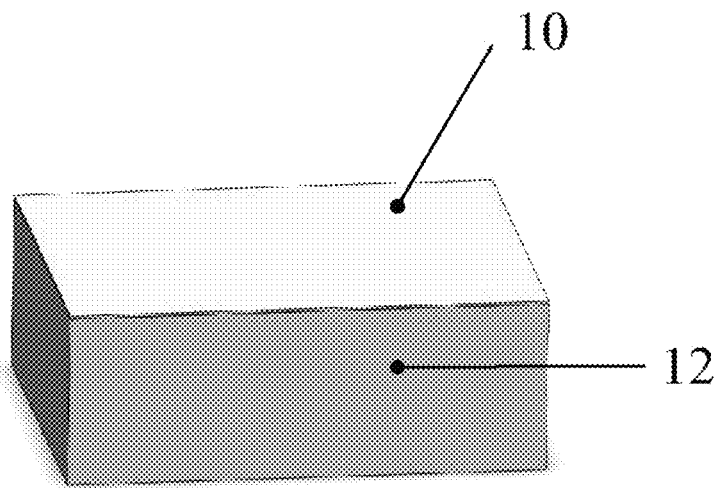
FIGS. 1(a) and 1(b) are schematic illustration of wrinkle formation during compression of a bilayer film.
Figure 1B:
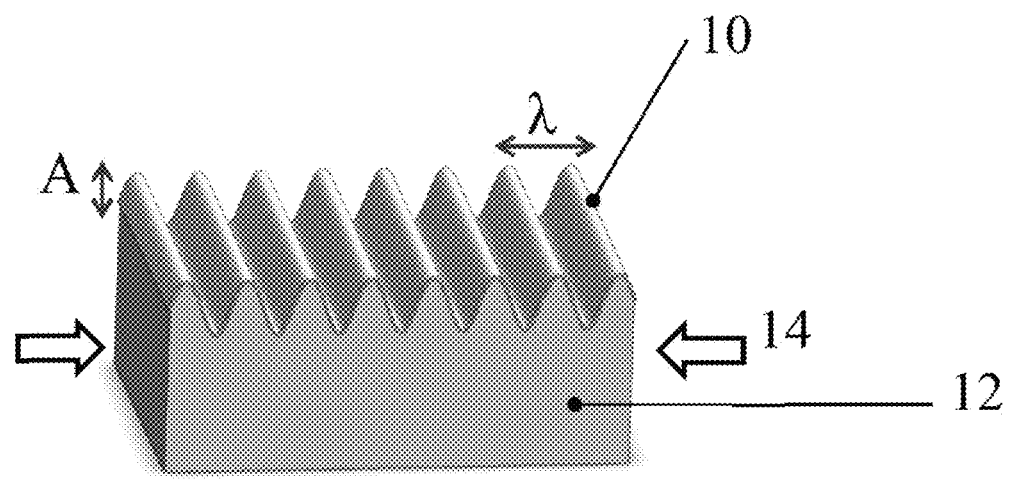
Figure 2A:
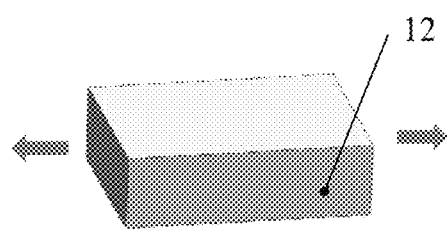
FIGS. 2(a), 2(b), 2(c), and 2(d) are schematic illustration of the process of wrinkle fabrication via a pre-stretch based film compression technique.
Figure 2B:
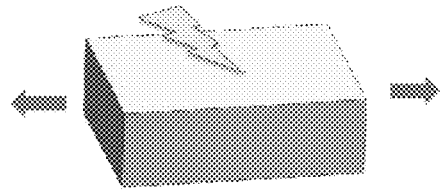
Figure 2C:
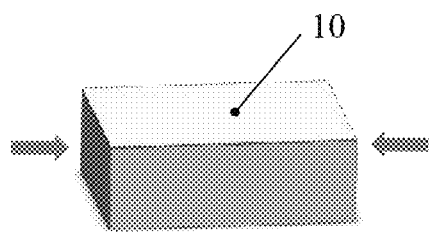
Figure 2D:
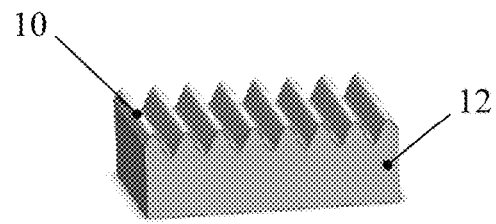

To enable the fabrication and tuning of wrinkle patterns, one must solve these sub-problems: (i) fabrication of a bilayer system with the desired material properties and geometry, (ii) compression of the top stiff film, and (iii) in-situ visualization of pattern formation.

Stretchable bilayers with large stiffness ratio can be fabricated by attaching or growing a thin stiff film 10 on top of a thick elastomeric base 12. For example, exposing a polydimethylsiloxane (PDMS) film to air or oxygen plasma leads to the formation of a thin glassy layer on top of the exposed PDMS surface via oxidation. Alternatively, a metallic or polymeric thin film may be deposited on top of PDMS to obtain the desired bilayer. The top layer thickness can be tuned by controlling the duration of plasma oxidation or the deposition process; whereas the stiffness ratio may be tuned by selecting the appropriate top/bottom materials. The preferred embodiment of the stage can be used with both plasma oxidation and metal/polymer film deposition techniques to generate a stiff thin film on top of an elastomeric PDMS layer.

Compression of the top film can be achieved by either directly compressing the bilayer or by generating a residual compressive strain in the top layer. As direct compression requires sustained loading to maintain the wrinkles, residual compression is often the preferred scheme. During mechanical loading, residual compression can be generated by first stretching the PDMS base and then attaching/growing the stiff film on top of this pre-stretched base layer. On releasing the prestretch in the PDMS, the top layer undergoes compression that leads to formation of wrinkles. The preferred embodiment of this stage can be used to implement this prestretch-based technique to generate compressive strains in the thin film.

The morphology of wrinkles depends on both the magnitude and the nature of compressive strains that are applied to the thin film. The nature of the applied strain can be classified into three different types: (i) equibiaxial, (ii) uniaxial, and (iii) sequential biaxial. Equibiaxial strains lead to 2-D periodic morphologies such as triangular, hexagonal, square checkerboard, and zigzag modes whereas uniaxial strain leads to 1-D sinusoidal patterns. For both of these types of strains, the morphology of wrinkles also changes when the compressive strain is progressively increased. During uniaxial loading, this change occurs as a transition from a single-period sinusoidal mode to higher modes of successive period-doubling bifurcations. During equibiaxial loading, the change occurs as transition to a more energetically favorable morphology for the corresponding strain.

The effects of equibiaxial and uniaxial strains have been extensively studied in the past due to the relative ease of access to equipment/techniques. However, due to lack of appropriate biaxial tensile stages the effect of sequential biaxial loading is not well understood. Past studies demonstrate that stepwise loading, i.e., loading along one axis followed by loading along the orthogonal axis leads to preferential selection of the zigzag mode. This suggests dependence of morphology on loading path in addition to the magnitude and nature of the strains. However, this path dependence hypothesis is experimentally unverifiable in the absence of tools to apply loads along different paths. In fact, a majority of the design space remains unexplored due to the lack of experimental tools. The present biaxial tensile stage enables one to explore this design space.

The steps of the wrinkle fabrication process are illustrated in FIGS. 2(a), 2(b), 2(c), and 2(d). The steps are (i) fabricating the base PDMS film 12, (ii) clamping the PDMS film in the tensile stage, (iii) extension of the PDMS film, (iv) plasma oxidation of the stretched PDMS film or deposition of metallic/polymeric thin film 10, and (v) release of the prestretch in the PDMS film. The role of the biaxial tensile stage is to provide the means to (i) control the stretch in the PDMS base layer, (ii) hold the prestretch during plasma oxidation or metal/polymer deposition, and (iii) perform a controlled release of the prestretch. Wrinkle patterns are obtained upon partial or full release of the pre-stretch. Additionally, the stage must have alignment features to register itself to a vision system both before and after plasma oxidation to enable in-situ visualization of wrinkle formation. The present stage satisfies of all of these requirements.

Figure 3A:
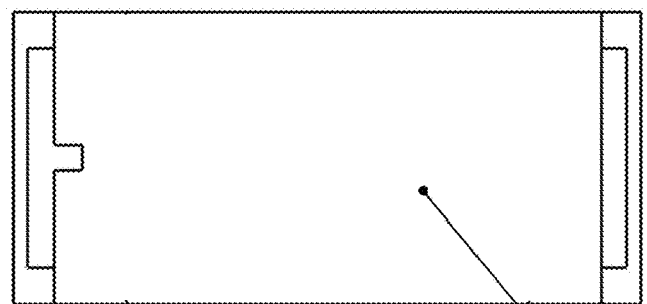
FIGS. 3(a) and 3(b) are top and front side views of a film for uniaxial stretching.
Figure 3B:
Figure 3C:
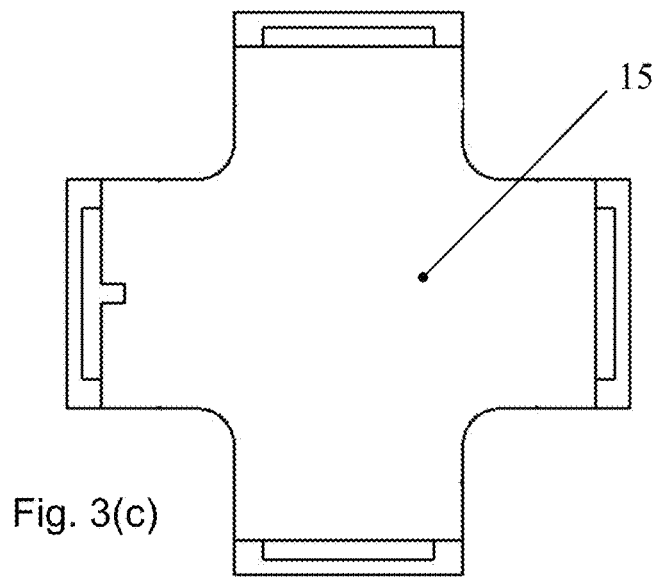
FIGS. 3(c) and 3(d) are top and front side views of a film for biaxial stretching.
Figure 3D:
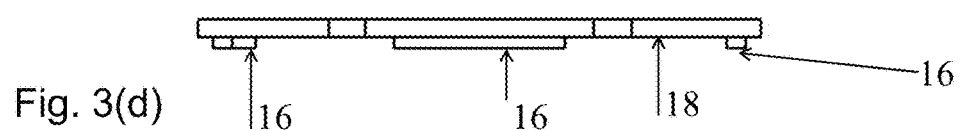

As the size of the motion stage scales with the size of the PDMS films 15 being stretched, it is necessary to select the size of the PDMS films before designing the stage. For this embodiment, the size of the films was determined by microfluidics-based applications wherein the chip/device is about a cm to an inch square. Rectangular films were selected for uniaxial stretching films and symmetric cross-shaped films were selected for biaxial stretching. These films are illustrated in FIGS. 3(a) and 3(b). The stretched length is 37.5 mm for rectangular films and 43 mm for cross-shaped films, clamped width is 20 mm, and the film thickness varies from 1.9-2.2 mm. The PDMS films were fabricated by thermally curing the commercially available Sylgard 184 two-part silicone elastomer mixture in a ratio of 1 part curing agent to 12 parts resin by weight. Details of the curing protocol are found in "Saha, S. K., 2014, Predictive Design and Fabrication of Complex Micro and Nano Patterns Via Wrinkling for Scalable and Affordable Manufacturing, Ph.D. thesis, Massachusetts Institute of Technology, Cambridge, Mass.", the contents of which are incorporated herein by reference. To align the edges of the film to the alignment edges 21 on the clamps, alignment features 16 were generated on the bottom surfaces 18 of the films by incorporating them directly into the molds used for curing. These alignment features ensure that the length of the stretched section is accurately known during stretching.

Figure 4A:
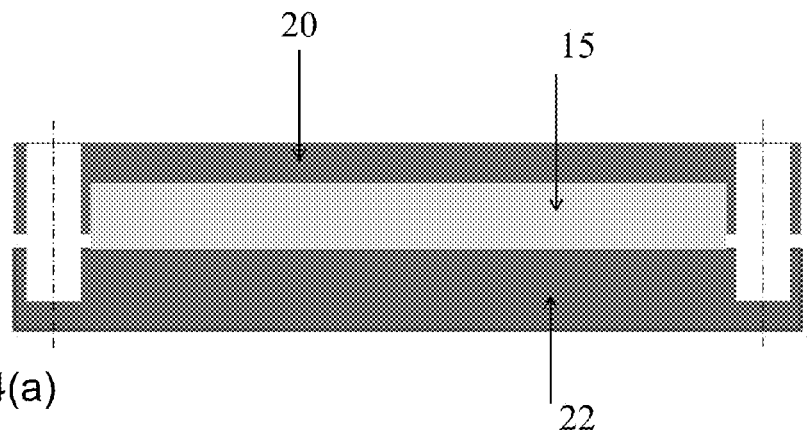
FIGS. 4(a) and 4(b) are cross-sectional and perspective views, respectively, of the film clamping mechanism in an embodiment of the biaxial tensile stage disclosed herein.
Figure 4B:
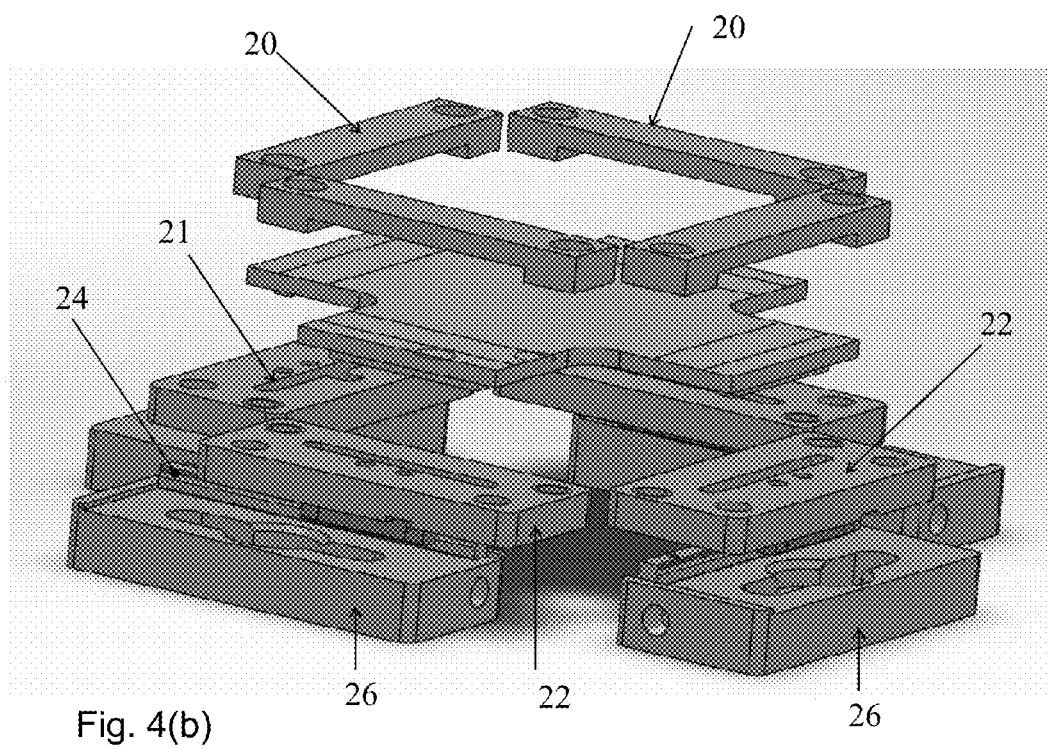

The PDMS films 15 are held onto the stage platforms via custom-made compression clamps that are illustrated in FIG. 4. These clamps were designed to provide a repeatable and sufficiently high compression during clamping. Each clamp consists of a set of two parts 20 and 22 that when bolted together leave a fixed gap between the two. The gap between the two parts is designed to be smaller than the thickness of the PDMS films. Thus, when the PDMS film is clamped between these parts, the amount of clamping compression in the film is repeatable and is determined by the difference in the film thickness and the predetermined gap between the parts.

To avoid over-constraint during biaxial stretching, it is necessary to allow for the movement of the edges along the non-actuated direction. For example, edges oriented along the X direction must be free to move along the X axis whereas edges along the Y direction must be free to move along the Y axis. When all four edges are clamped, over-constraint can be avoided by implementing rolling boundary conditions at each edge. In this embodiment, these edge rolling conditions were implemented by introducing miniature linear ball bearings 24 between each of the clamp bottoms 22 and the corresponding platforms 26. The rail of the miniature bearings is rigidly attached to the stage platforms 26 and the guides of the miniature bearings is attached to the bottom half of the clamps 22. The miniature bearings are oriented along the edges, thereby allowing linear motion between the stage and the clamp along the edges. During biaxial loading, these roller bearings ensure that the stretches along the two axes are independent of each other.

Figure 5:
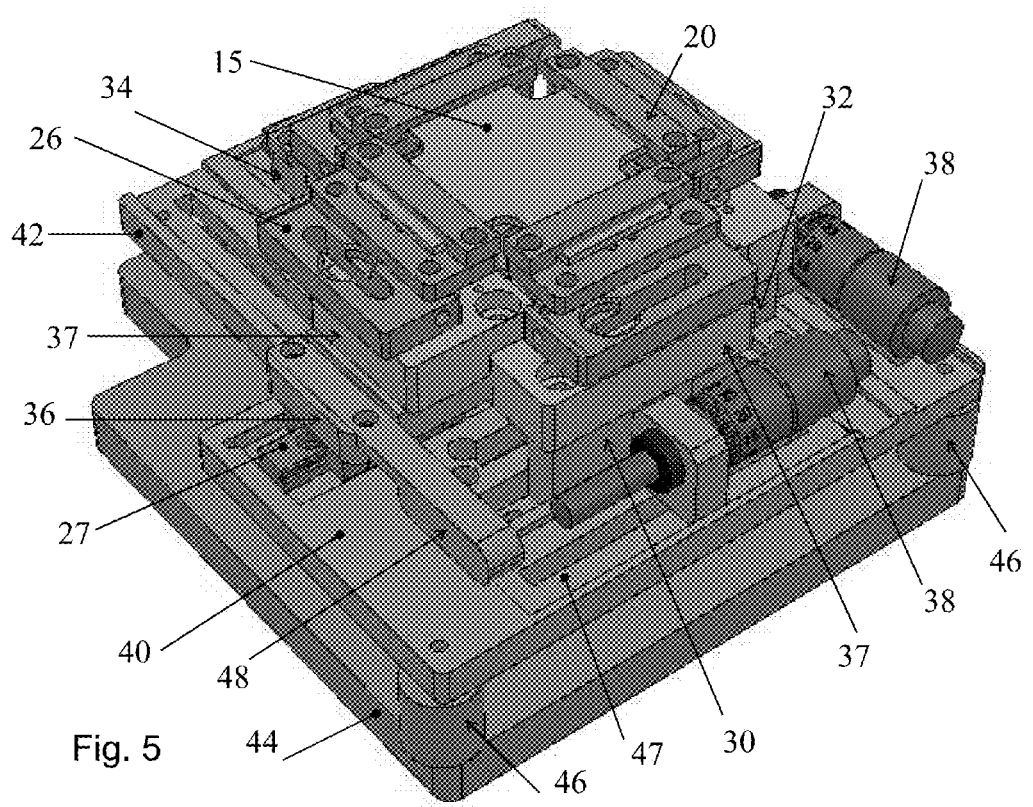
FIG. 5 is a perspective view of an embodiment of the biaxial tensile stage disclosed herein.
Figure 6A:
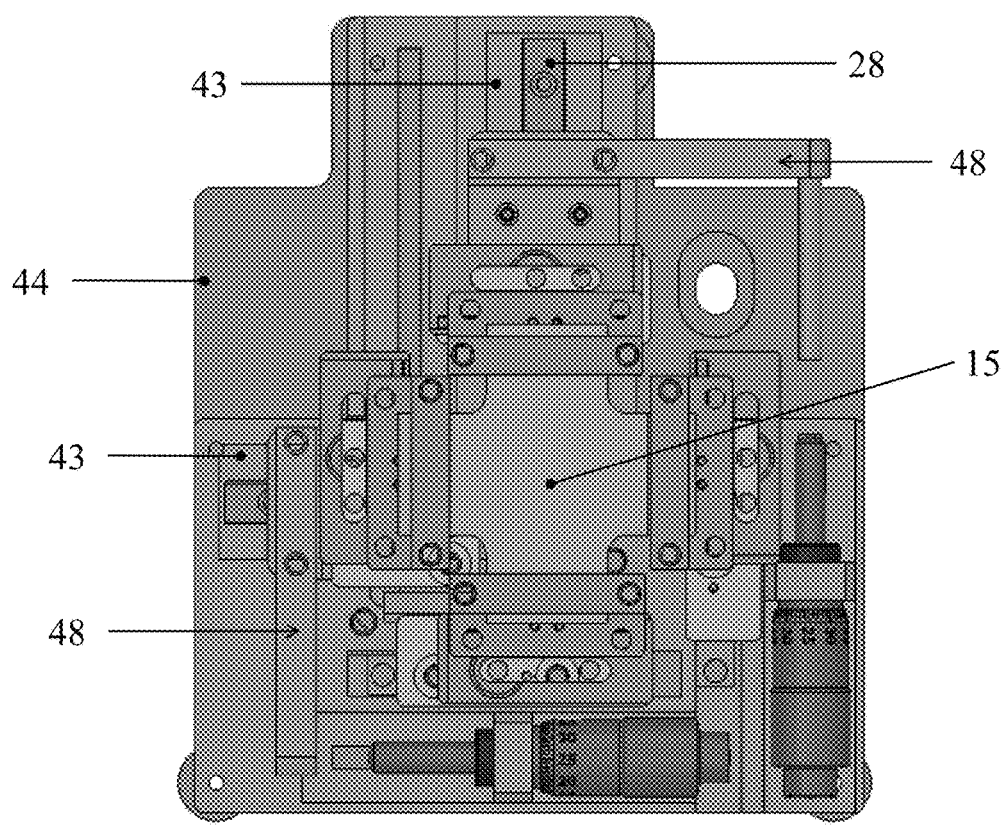
FIGS. 6(a), 6(b), and 6(c) are top, side, and front views, respectively, of an embodiment of the biaxial tensile stage disclosed herein.
Figure 6B:
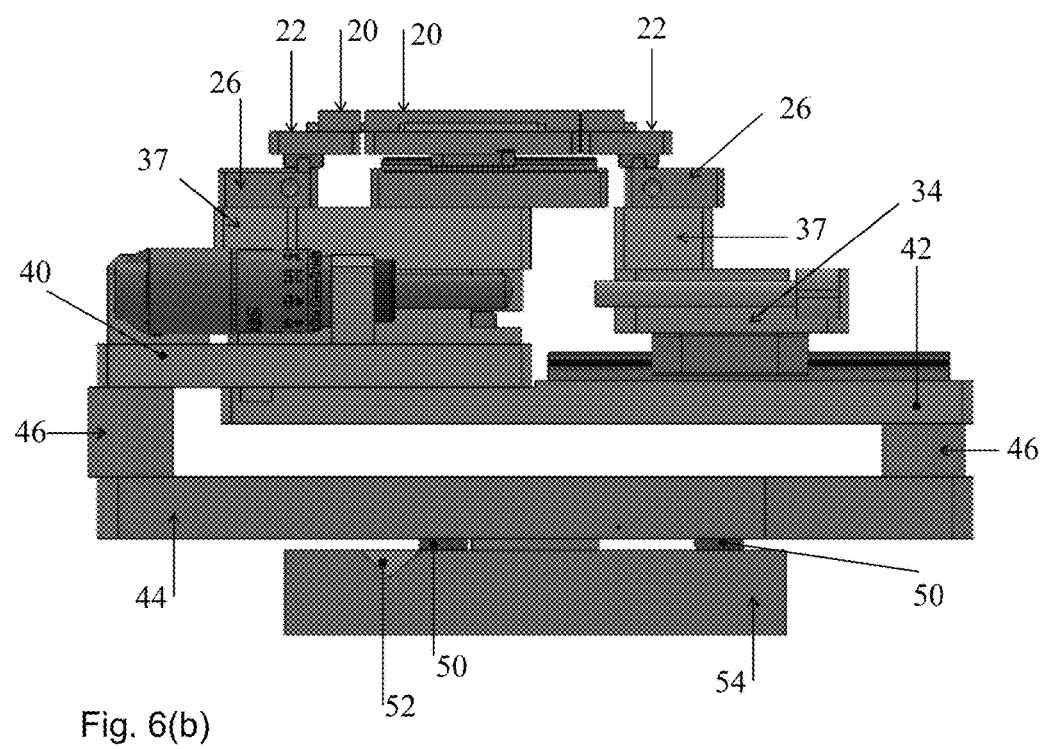
Figure 6C:
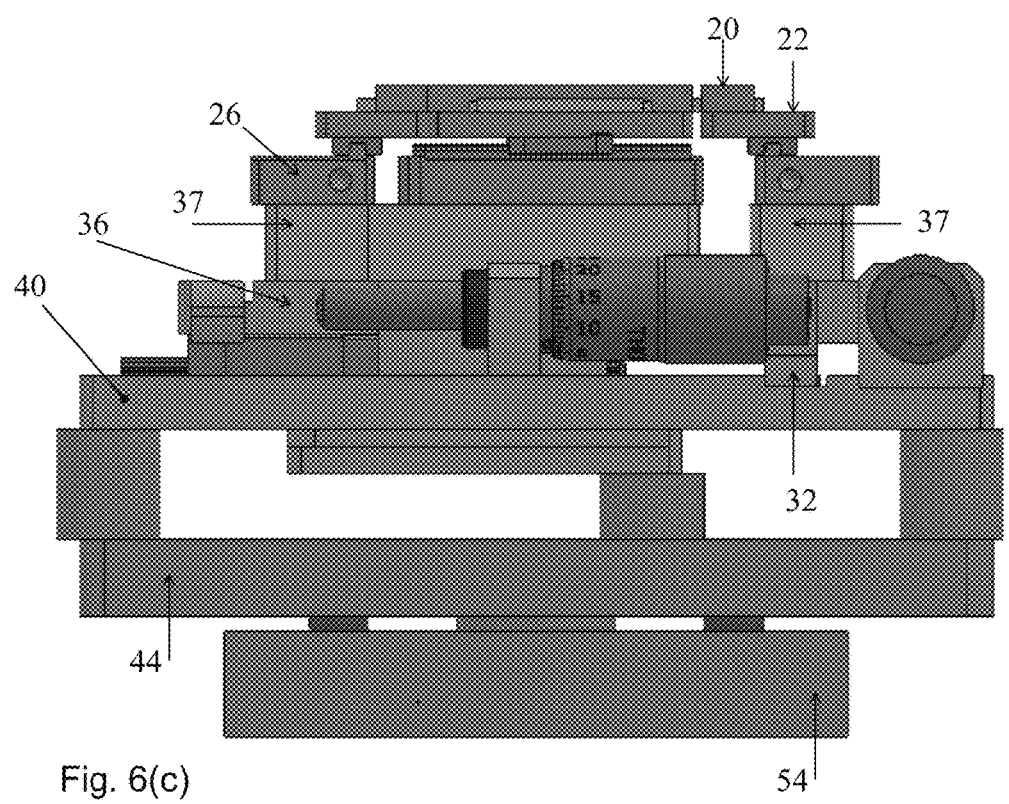

The purpose of the motion stage is to provide the desired stretching motion while minimizing the parasitic motions. Based on the tradeoff for range versus accuracy, linear bearings that are based on the ball guide and rail mechanism were selected to guide motion along the two axes. This mechanism is illustrated in FIG. 5 and FIGS. 6(*a*), 6(*b*), and 6(*c*). The linear bearings 27, 28 for the two axes are oriented perpendicular to each other and can be independently actuated to stretch the PDMS film 15. To stretch the film, two orthogonal edges of the film are clamped onto stationary platforms 30, 32 and the corresponding opposing edges are clamped onto the moving platforms 34, 36 that are mounted on the linear guides 28 and 27. Actuation of each moving platform is performed manually via micrometer heads 38. As the two axes can be independently actuated, the stage may be used for both uniaxial and biaxial stretching.

Machined alignment features and mating of precision machined surfaces were used to align and stack the two motion stages. Alignment features were used to perform in-plane alignment of (i) stationary platform perpendicular to the linear rail, (ii) actuation direction parallel to linear rails, and (iii) the two linear rails perpendicular to each other. To do so, linear bearings and the stationary platforms were first mounted and aligned onto separate base plates 40, 42 and then the two base plates were aligned to each other. On each plate, rail seat 43 was first machined out and then this seat was used as a reference for machining out all in-plane alignment features. To ensure that all of the moving and stationary platforms are at the same height to within ±25 um, the following measures were taken: (i) spacers 37 were placed on top of the platforms 30, 32, 34, 36 such that stacking of the components of each platform would lead to the same nominal height across all platforms and (ii) shim stock was used during assembly of the platforms. The two base plates 40, 42 where then bolted to the structural frame 44 with spacers 46 between them.

In this embodiment, micrometer heads 38 that are mounted in the grooves 47 on the base plates of the stage are used to manually and independently actuate the two movable stages. The position of the micrometer heads along these groves may be changed to tune the starting position of the actuation range. To reduce the overall size and to integrate the heads onto the stage, mechanical couplings between the micrometer heads and the movable platforms 34, 36 were eliminated. Instead, the micrometer heads push directly onto the extension arms 48 of the movable platforms. Each micrometer head sits in between the movable platforms and stationary platforms and sets the minimum distance between the two platforms. As the heads are not rigidly connected to the movable platforms, they are incapable of pulling the platforms. Therefore, during actuation the movable platforms are free to move away from the stationary platforms, but not toward them. When PDMS films are mounted onto the stage and stretched, tension in the film provides the restoring force to the actuation motion. This restoring force on the movable platform keeps it from moving further away while the platform's position is held by the micrometer head. The PDMS film can be stretched further by actuating the micrometer to push onto the movable platform; whereas the tension can be released by actuating the micrometer in the opposite direction. Thus, actuation of the micrometer head can be used to control the tensile stretching of the film but cannot be used to compress the base layer.

The unidirectional actuation capability of the stage can be used to accurately identify the zero stretch point during film stretching. During stretching and stretch release, the movable platform tracks the micrometer head and stays in contact with it as long as a non-zero restoring force due to tension exists. In this embodiment, this restoring force is measured as the contact force at the contact between the micrometer head and the movable stage using a force dependent resistor in half-bridge Wheatstone arrangement. The zero stretch point can then be identified within a tolerance band by measuring this contact force during stretching and stretch-release. For the present system, the smallest force that could be accurately measured was 100 mN. This corresponds to an error of 0.06% in the film strain. This zero error is about 2 to 5 times less than the critical strain for wrinkling bifurcation and is substantially less than the operating strains of 5-15%.

In this embodiment, passive thermal management schemes have been used to ensure that mechanical stretching is minimally distorted by thermal strains and to hold positional accuracy during imaging. The film generation step that consists of plasma oxidation is the primary source of heat during the process. Thermal errors during film generation can be managed by (i) performing intermittent plasma oxidation with a maximum continuous exposure time of five minutes to prevent overheating of the stage and (ii) limiting the rise in temperature by increasing the thermal mass of the stage. The thermal mass of the stage was increased by attaching strips of a phase change material with a transition temperature of 50° C. on the exposed surfaces of the stage. These two schemes minimize the thermal errors associated with the film generation process. After film generation, the stage is cooled down to room temperature before performing any subsequent operation. This ensures that heating of the stage has minimal influence on position measurements during imaging.

The goal of thermal strain management is to maintain the thermal strains lower than the critical wrinkling strain ($\varepsilon_c$); under this condition, thermal strains alone would not lead to wrinkled surfaces. Due to the layout of the mechanical constraints, there is no thermal strain in the PDMS film due to thermal expansion of PDMS. As the stiffness of PDMS is at least three orders of magnitude less than the stiffness of the base/micrometer, all of the thermal strain in PDMS is due to expansion of the micrometer head and the base of the stage. Thus, the thermal strain ($\varepsilon_t$) in the constrained PDMS film that arises due to a uniform temperature rise of $\Delta T$ is given by: $\varepsilon_t = \Delta T (\alpha_a L_b + (L_s - L_b) \alpha_a)/L_s$ Here, $\alpha_a$ and $\alpha_b$ are the coefficient of linear thermal expansion of the actuator and the base, $L_s$ is length of the stretched PDMS film, and $L_b$ is the distance between the base of the actuator and the fixed platform. The temperature rise necessary for a thermal strain that is equal to the critical strain can be estimated from the following values: $L_s=43$ mm, $L_b=18$ mm, $\alpha_a=13e-6/K$, $\alpha_b=22.2e-6/K$, and $\varepsilon_e=0.1\%$. For these conditions, the maximum allowable use in temperature of the stage is 59.3° C.

To verify the effectiveness of the thermal management scheme, temperature at various spots on the stage was measured after an unstretched PDMS film was exposed to air plasma for 90 minutes. The exposure cycle consisted of 5 minutes of continuous exposure followed by a five minute interval during which the plasma was switched off. Immediately after cumulative plasma exposure of 90 minutes, temperature at various spots on the stage was measured using a thermocouple probe. Temperature was observed to vary within the range of 50-60° C. over the surface of the stage. The maximum temperature was Observed on the clamps and the minimum temperature was observed on the exposed surface of the extension arm. The surface of the exposed PDMS film was examined under an atomic force microscope to verify that no wrinkles were formed under thermal strains; i.e., the thermal strains were lower than the critical strain. Under the AFM microscope, a flat non-wrinkled surface was observed that had a surface roughness (Ra) of 3.5 nm over a scanned area of 30 um×30 um. This justifies the approximation that the thermal strain on this tensile stage during plasma oxidation is negligible as compared to the strain due to mechanical stretching.

Figure 7:
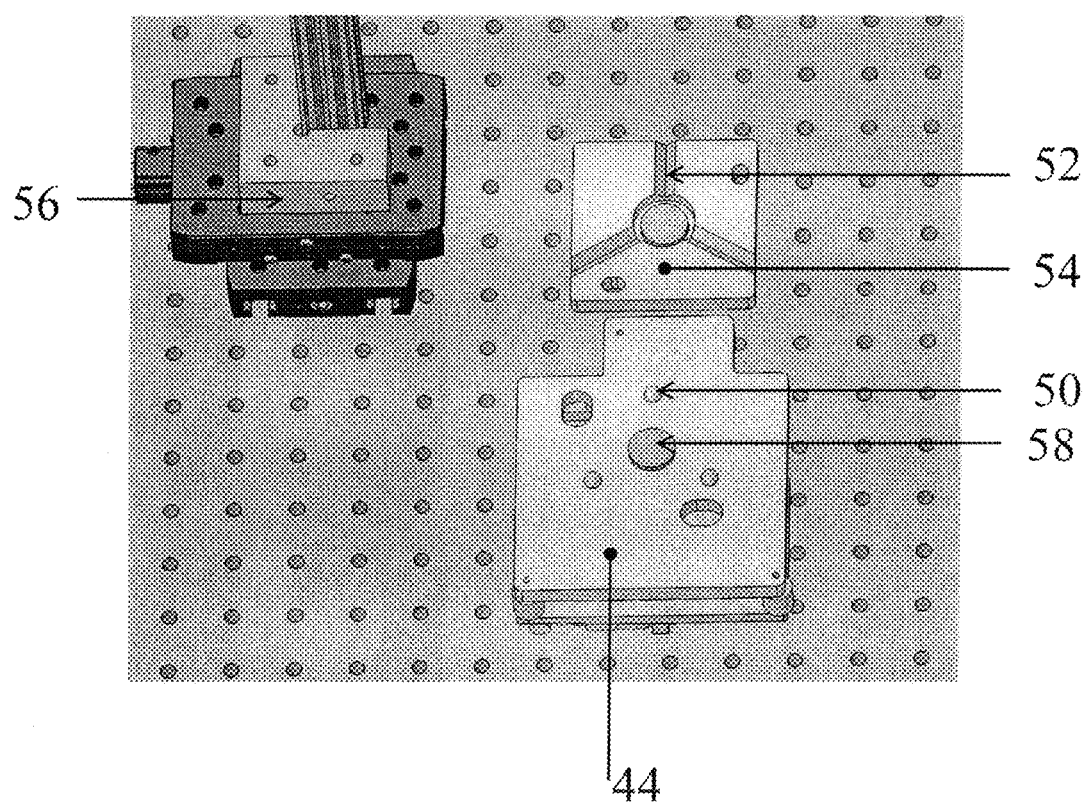
FIG. 7 is an illustration of the biaxial tensile stage while being registered to the vision system. The stage is flipped to illustrate the kinematic coupling mechanism.

In this embodiment, a '3-ball and NT-groove' kinematic coupling has been used to implement a quick and repeatable attach/detach mechanism for precise registration of the stage to the metrology frame. The coupling arrangement is illustrated in FIG. 7. The kinematic coupling consists of (i) a set of three balls 50 that are affixed to the base of the stage and (ii) a set of three V grooves 52 that are fabricated into a separate plate 54 that forms part of the metrology frame. In this system, the plate 54 with the three V grooves is held stationary with respect to the X-Y stage 56 of the metrology frame. Preload to the coupling is provided by a pair of permanent magnets 58 that are attached to the two plates of the coupling. Thus, the tensile stage can be registered to the vision system by engaging the two halves of the coupling. Registration of the stage to the metrology frame involves aligning and locating the coordinate frames of the two systems with respect to each other. To enable quick registration, alignment is performed in two stages. First, an initial alignment is performed to achieve these registration requirements; then the kinematic couplings are used to maintain the registration during repeated engagement-disengagement of the tensile stage from the metrology frame.

The ability of this stage to generate patterns that are not accessible via equibiaxial strains has been demonstrated by fabricating a non-uniform zigzag wrinkled pattern that exhibits period doubling only along one axis. Additionally, the feasibility of tuning patterns is demonstrated via tuning of (i) strain states and (ii) actuation paths. This was achieved by performing a series of biaxial stretch release and stretching operations on a bilayer film that consists of a titanium thin film deposited on top of a biaxially pre-stretched PDMS film. The bilayer was fabricated by depositing a titanium film of thickness 84.2±3.3 nm on top of a stretched PDMS film via RF sputtering. The PDMS base layer was pre-stretched by sequentially stretching the film along the Y axis by 6.0% and then along the X axis by 6.0%. During stretching along the Y axis, the X axis was held "free" to allow for Poisson's contraction along the X axis. Subsequent stretching along the X axis was performed from a starting position that corresponds to a zero normal stress along X. This stress state is ensured by the zero-contact condition of the actuation mechanism.

Figure 8A:
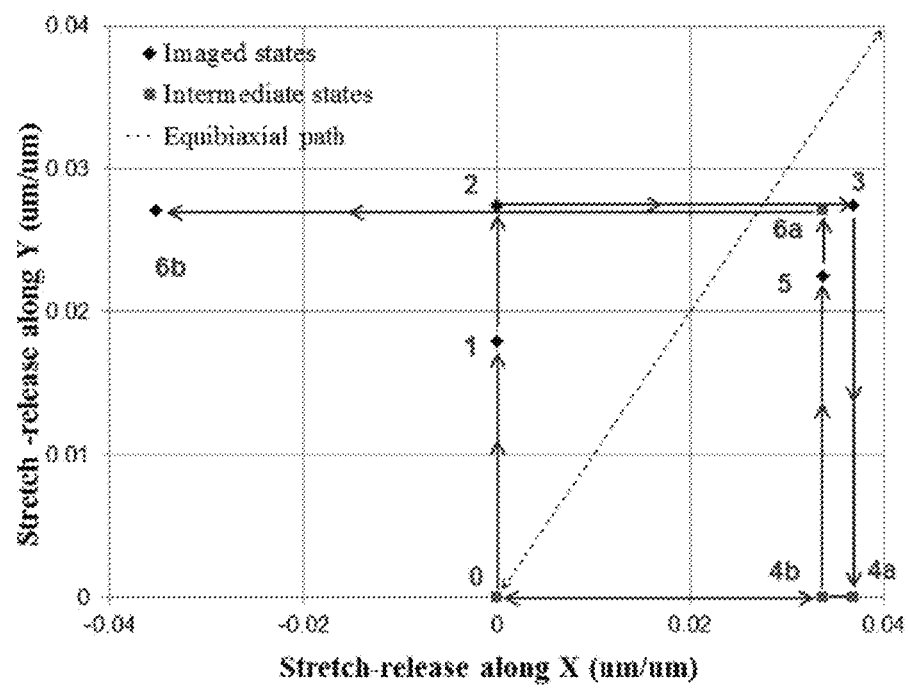
FIGS. 8(a) and 8(b) are illustration of the application of the tensile stage for fabrication of wrinkle patterns.
Figure 8B:
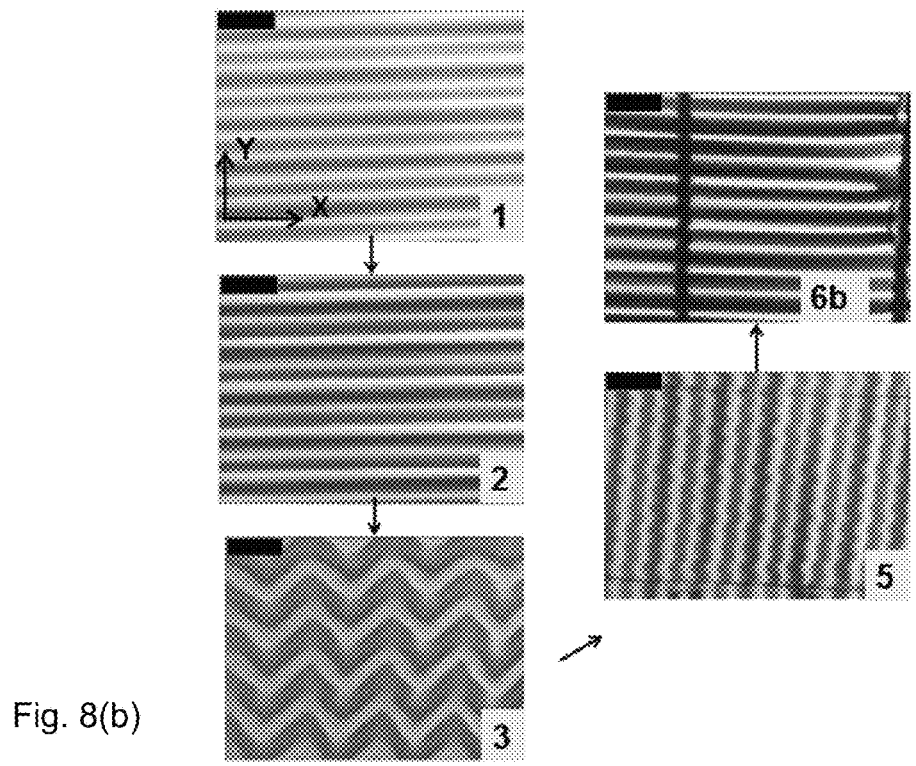

The sequence of stretch release and stretching operations is summarized in FIG. 8(a) and the images of the corresponding patterns are illustrated in FIG. 8(b). Stretch release and stretching were performed along the following path: $0 \rightarrow 1 \rightarrow 2 \rightarrow 3 \rightarrow 4a \rightarrow 0 \rightarrow 4b \rightarrow 5 \rightarrow 6a \rightarrow 6b$. During uniaxial stretch release along Y axis from state 0 to 1, one observes the formation of 1-D wrinkles that exhibit period doubling behavior. Period doubling becomes more prominent with further stretch release from state 1 to state 2. On subsequent stretch release along the X axis, one observes the formation of zigzag patterns that demonstrate period doubling along both axes. The zigzag pattern is the characteristic pattern that is generated during sequential stretch release of a pre-stretched bilayer and is generated due to in-plane buckling of the aligned 1-D wrinkles.

The patterns that are formed via wrinkling are reversible and can be tuned by changing the strain state and the actuation path. When the bilayer is stretched to bring it back from state 3 to a zero-strain state 0 via the intermediate state 4a, it is observed that the zigzag patterns transform into a flat state. Upon subsequent stretch release to state 5 via state 4b, a non-uniform zigzag pattern is obtained that has the dominant period oriented horizontally. The characteristics of this new asymmetric 2-D pattern are: (i) smaller amplitude along the Y axis and (ii) period doubling behavior along the X axis. This non-uniform zigzag pattern is formed due to the asymmetry in the effective compressive strains along the two axes. During the intermediate stretching and stretch release steps, horizontally aligned cracks arise due to a mismatch between the Poisson's ratio of PDMS and titanium. During stretch release along the Y axis, the effective compressive strain for buckling is reduced by the amount necessary for closing these cracks. This accounts for the lower amplitude along the Y axis of the zigzag patterns that are observed in state 5. Thus, this 2-D tensile stage enables fabrication and tuning of such asymmetric 2-D modes that are not accessible via equibiaxial strains.

Although the 2-D patterns that are formed via wrinkling are actuation path dependent, they are not necessarily "locked-in". This means that the wrinkle pattern changes when the strain state is changed. Thus, it is possible to tune a wrinkled pattern across different modes by changing the strain states without ever going into an intermediate flat zero-strain state. This tunability has been demonstrated by changing the strain state of the bilayers from state 5 to state 6b via state 6a. In the final state 6b, the titanium film is under tensile stretching along the X axis; this state of strain does not support wrinkle formation along the X axis. The observed wrinkled pattern in state 6b confirms this expectation as the pattern transforms from an asymmetric 2-D mode into a uniaxial 1-D mode that comprises horizontally aligned wrinkles. The tensile state of strain along the X axis can be verified by the presence of wide vertical cracks that are formed due to tensile stretching of the titanium film. These cracks can be further used to generate asymmetric 2-D modes that are not accessible via equibiaxial strains.

The present invention is a compact biaxial tensile stage that provides the means to apply accurate, large, and non-equal biaxial strains for wrinkle pattern formation. This stage can be used as (i) an experimental tool to study and characterize wrinkle formation and/or (ii) manufacturing equipment for low-cost fabrication of micro and nano scale patterns. Although biaxial tensile stages that are capable of providing large and accurate strains are commercially available, adapting such stages for wrinkle pattern formation is challenging. These challenges arise due to the need for a mobile and compact stage that can (i) fit into vacuum chambers, (ii) accurately maintain the strain during thin film generation/deposition, and (iii) readily allow for in-situ imaging, i.e., real-time imaging during stretch release. The present stage solves these challenges by (i) eliminating mechanical coupling between the actuators and the movable platforms, (ii) integrating the actuators onto the stage, and (iii) incorporating a kinematic coupling to quickly and accurately register the stage to a custom-built vision system. In this embodiment, the stage has a footprint of 131 mm×11.0 mm×75 mm and can provide a maximum strain of 33.5% with a resolution of 0.027% while holding an accuracy of 7 um for repeated registrations to the vision system.

The present stage may be applied to (i) study the non-uniformity in the period of wrinkles over a plasma-exposed or metal/polymer coated PDMS film, (ii) study transition of single-period sinusoidal wrinkles into the period-doubled higher mode during prestretch release at high compressive strains, and (iii) fabricate complex asymmetric 2-D wrinkled patterns that are not accessible via equibiaxial strains. As the morphology of the 2-D wrinkled pattern is determined by both the current strain state and the past strain history of the system, this strain path dependence of wrinkle pattern formation opens up a new design scheme for reconfigurable/tunable wrinkles. This stage provides the means to apply sequential unequal biaxial strains thereby enabling one to reversibly and/or irreversibly reconfigure a single bilayer system to exhibit different types of wrinkled patterns. One may apply the present stage to systematically explore and characterize this design space to fabricate and tune reconfigurable 2-D wrinkled patterns that are functionally-relevant in applications such as optical/biological sensing and microfluidics circuits.

It is recognized that modifications and variations of the present invention will be apparent to those of ordinary skill in the art and it is intended that all such modifications and variations be included within the scope of the appended claims.

What is claimed is:

1. A method of making an asymmetric 2-D wrinkle pattern, comprising the steps of:
    providing a stretchable base substrate;
    holding the base substrate across a set of clamps, wherein each clamp of the set of clamps holds a corresponding edge of the base substrate;
    stretching the base substrate along two orthogonal axes, thereby forming a biaxially stretched base layer;
    wherein a bearing allows free movement between each clamp and a stage along a direction parallel to the corresponding edge of the base substrate during the stretching
    generating a thin film on top of the stretched base layer, thereby forming a composite material comprising a thin film on top of a stretched base layer;
    releasing the stretch in the stretched base layer of the composite material along a first direction through a sequence of stretching and stretch release steps along the two orthogonal axes, wherein releasing the stretch along the first direction causes the thin film to buckle and generate wrinkles along the first direction and also causes the film to crack along a second direction that is orthogonal to the first direction;
    further releasing the stretch in the stretched base layer of the composite material along the second direction through a sequence of stretching and stretch release steps along the two orthogonal axes, wherein releasing the stretch along the second direction causes the thin film to buckle along the second direction, thereby forming an asymmetric 2-D wrinkle pattern.

2. The method of claim 1, wherein the asymmetric 2-D wrinkle pattern is a non-uniform zigzag pattern.

3. The method of claim 1, wherein the stretch in the biaxially stretched base layer along the two orthogonal axes are identical.

4. The method of claim 1, wherein the biaxially stretched base layer is formed by first stretching the base substrate along one axis and then stretching the base substrate along the orthogonal axis.

5. The method of claim 1, wherein the biaxially stretched base layer is formed by first stretching the base substrate along a first axis and then stretching the base substrate along a second axis that is orthogonal to the first axis, and wherein the base substrate is held in a manner to freely allow for Poisson's contraction along the second axis during stretching along the first axis.

6. The method of claim 1, wherein the stretch release along the first direction is achieved by a single step of releasing the stretch along the first direction.

7. The method of claim 1, wherein the stretch release along the second direction is achieved by a single step of releasing the stretch along the second direction.

8. The method of claim 1, wherein the stretch along the first direction is partially released.

9. The method of claim 1, wherein the stretch along the second direction is partially released.

10. The method of claim 1, wherein releasing the stretch along the first direction causes the generation of period doubled wrinkles along the first direction.

11. The method of claim 1, wherein releasing the stretch along the second direction causes the generation of period doubled wrinkles along the second direction.

12. The method of claim 1, wherein the period of wrinkles along the first stretch-released direction is higher than the period of wrinkles along the second direction.

13. The method of claim 1, wherein the Poisson's ratio of the top film and the base layer are different.

14. The method of claim 1, wherein there is a mismatch between the elastic moduli of the top film and the base layer with the film being stiffer than the base.

15. The method of claim 1, wherein the thin film is generated on top of the base layer by physical or chemical vapor deposition.

16. The method of claim 1, wherein the thin film is generated on top of the base layer by oxidizing the surface of the base layer.

17. The method of claim 1, wherein the top film is made from a single material.

18. The method of claim 1, wherein the top thin film is titanium.

19. The method of claim 1, wherein the base layer is made from polydimethylsiloxane (PDMS).

20. A method of making an asymmetric 2-D wrinkle pattern, comprising the steps of:
   providing a stretchable base substrate;
   holding the base substrate across a set of clamps, wherein each clamp of the set of clamps holds a corresponding edge of the base substrate;
   stretching the base substrate along two orthogonal axes, thereby forming a biaxially stretched base layer;
   wherein a bearing allows free movement between each clamp and a stage along a direction parallel to the corresponding edge of the base substrate during the stretching
   generating a thin film on top of the stretched base layer, thereby forming a composite material comprising a thin film on top of a stretched base layer;
   releasing the stretch in the stretched base layer along a first direction through a sequence of stretching and stretch release steps along the two orthogonal axes, wherein releasing the stretch along the first direction causes the thin film to buckle and generate wrinkles along the first direction;
   further releasing the stretch in the stretched base layer along a second direction that is orthogonal to the first direction through a sequence of stretching and stretch release steps along the two orthogonal axes, wherein releasing the stretch along the second direction causes the thin film to buckle along the second direction, thereby forming an asymmetric 2-D wrinkle pattern.

* * * * *